(12) United States Patent
Ma et al.

(10) Patent No.: US 7,690,938 B2
(45) Date of Patent: Apr. 6, 2010

(54) ELECTRICAL CONNECTOR ASSEMBLY

(75) Inventors: Hao-Yun Ma, Tu-Cheng (TW);
Shih-Wei Hsiao, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/526,039

(22) Filed: Sep. 22, 2006

(65) Prior Publication Data
US 2007/0077792 A1  Apr. 5, 2007

(30) Foreign Application Priority Data
Sep. 22, 2005  (CN) .................. 2005 1 0094542

(51) Int. Cl.
*H01R 13/62* (2006.01)

(52) U.S. Cl. ............... 439/331; 439/71; 439/73

(58) Field of Classification Search ............. 439/331, 439/73, 71, 296
See application file for complete search history.

(56) References Cited

U.S. PATENT DOCUMENTS

| | | | | |
|---|---|---|---|---|
| 4,502,747 A * | 3/1985 | Bright et al. | | 439/296 |
| 4,560,217 A * | 12/1985 | Siano | | 439/331 |
| 6,648,656 B1 * | 11/2003 | Ma | | 439/73 |
| 6,752,636 B2 * | 6/2004 | Ma | | 439/73 |
| 6,869,303 B1 * | 3/2005 | Ma | | 439/331 |
| 6,875,038 B1 * | 4/2005 | McHugh et al. | | 439/331 |
| 6,899,553 B2 * | 5/2005 | Ma et al. | | 439/135 |
| 7,118,387 B2 * | 10/2006 | Wong | | 439/73 |
| 2005/0164530 A1 | 7/2005 | Yates et al. | | |
| 2005/0287858 A1 * | 12/2005 | Toda et al. | | 439/331 |

* cited by examiner

*Primary Examiner*—Briggitte R Hammond
(74) *Attorney, Agent, or Firm*—Andrew C. Cheng; Wei Te Chung; Ming Chieh Chang

(57) ABSTRACT

An electrical connector assembly (100) includes a housing (10), a number of signal terminals loaded in the housing (10) and a stiffener (11) disposed around the housing (10), a metal clip (13) and a lever (12) attached to two opposite sides of the stiffener (11), wherein a securing plate (15) is disposed between the metal clip (13) and the chip module (14), and the securing plate (15) is mounted above an upper surface of the chip module (14).

8 Claims, 8 Drawing Sheets

ELECTRICAL CONNECTOR ASSEMBLY

BACKGROUND OF THE INVENTION

1. Field of the Invention

The present invention relates to an electrical connector assembly, and more particularly to an electrical connector assembly for electrically connecting to a printed circuit board.

2. Description of Related Art

An electrical connector assembly 100' shown in FIG. 1 comprises a housing 5', a plurality of terminals received in the housing 5', a chip module 9' mounted in the housing 5', a stiffener 6' surrounding the housing 5', a metal clip 7' attached on an end of the stiffener 6' for pressing the chip module 9' and a lever 8' engaging with the other end of the stiffener 6' for locking the metal clip 7'. The metal clip 7' defines a pressing portion 71'. When the metal clip 7' is pressed downwardly, the pressing portion 71' abuts against the chip module 9' into the housing 5'.

However, the chip module 9' is directly mounted between the housing 5' and the metal clip 7'. When the lever 8' is rotated to press down the chip module 9', the chip module 9' bears two kinds of forces applied by the terminals and the metal clip 7'. In this case, the terminals received in the housing 5' generate a nonuniform deformation due to an uneven force applied on, which can lead to an open electrical connection between the chip module 9' and the terminals in a slight deformation section and destroy the terminals in a greater deformation section. So the chip module 9' can be crashed by the pressing portion 71'.

An improved electrical connector assembly 200' shown in FIG. 2 comprises a housing 10', a plurality of terminals received in the housing 10', a chip module 14' mounted in the housing 10', a stiffener 11' surrounding the housing 10', a metal clip 12' and a lever 13' engaging with two opposite ends of the metal clip 12' and a heat sink 15' attached on the chip module 14'. The heat sink 15' defines a flange 151'. The metal clip 12' presses the chip module 14' via the flange 151', which improves the pressing character thereof and electrical connection efficiency between the chip module 14' and the terminals received in the housing 10'. However, the heat sink 15' is mainly used for dissipating heat radiated by the chip module 14' and the material of the heat sink 15' must have a good heat dissipation, hence leading to a higher cost.

Thus, there is a need to provide a new electrical connector assembly that overcomes the above-mentioned problem.

SUMMARY OF THE INVENTION

An object of the present invention is to provide an electrical connector assembly which can provide a reliable and stable connection between a chip module and terminals thereof.

In order to achieve above-mentioned object, an electrical connector assembly of the present invention includes a housing, a plurality of signal terminals loaded in the housing and a stiffener disposed around the housing a metal clip and a lever attached to two opposite sides of the stiffener, wherein a securing plate is disposed between the metal clip and the chip module, and the securing plate is mounted above an upper surface of the chip module.

As an improvement of the invention, the securing plate can be packaged with the chip module as a unity.

As another improvement, the securing plate can be disposed separately from the chip module.

Relative to the conventional technology, the electrical connector assembly in accordance with the invention defines a securing plate. When the metal clip presses the chip module downwardly, the securing plate disposed between the metal clip and the chip module can provide a structure for preventing the chip module from deformation. In addition, when the securing plate is packaged with the chip module, the electrical connector assembly can be easily carried and assembled; when the securing plate is disposed separately from the chip module, the structure and shape of the securing plate can be altered in light of the structure of all kinds of the chip modules.

Other objects, advantages and novel features of the present invention will become more apparent from the following detailed description of the present embodiment when taken in conjunction with the accompanying drawings.

DETAILED DESCRIPTION OF THE INVENTION

Figure 1:
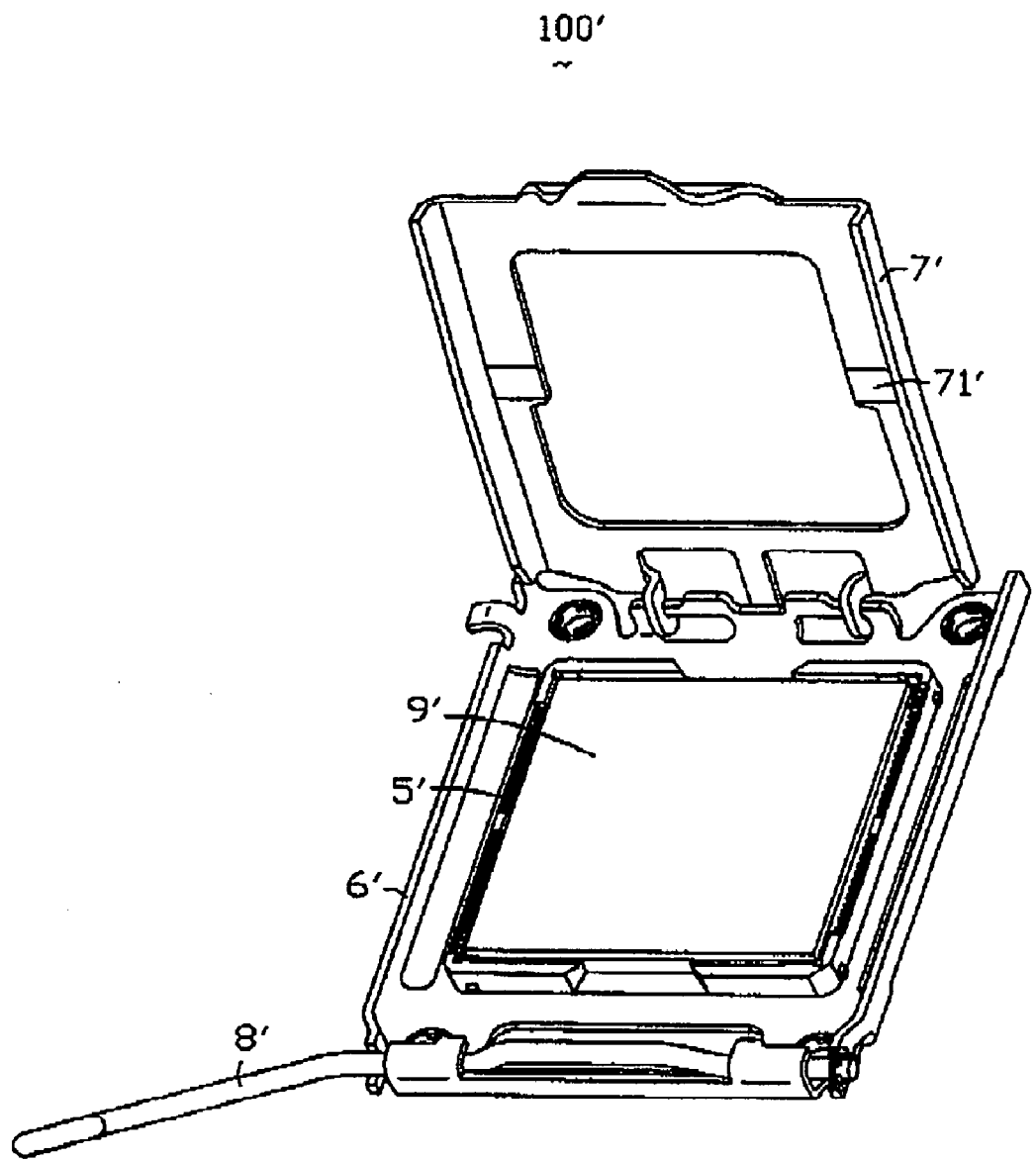
FIG. 1 is an exploded perspective view of a conventional electrical connector assembly, wherein the metal clip is open.
Figure 2:
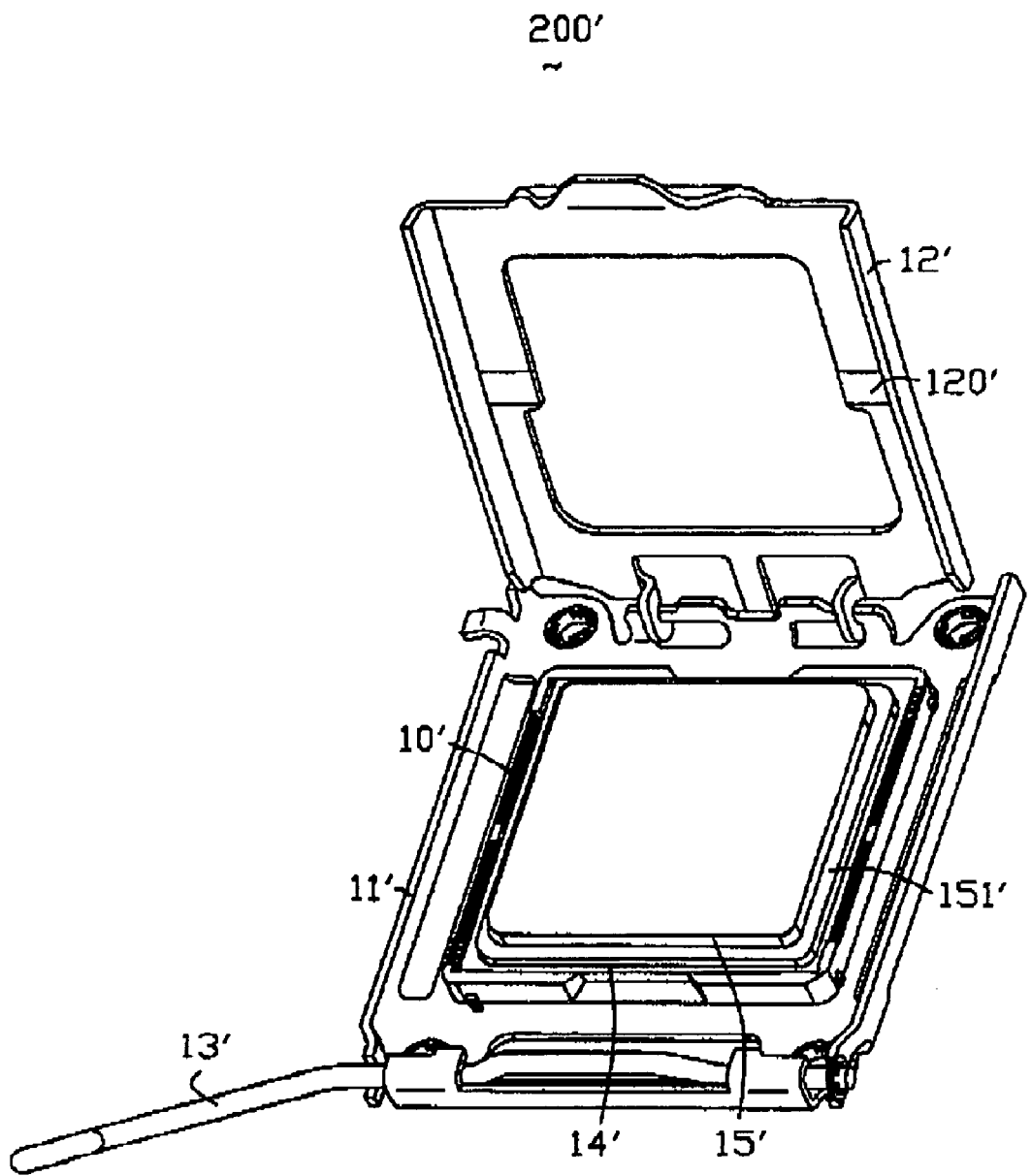
FIG. 2 is another exploded perspective view of a conventional electrical connector assembly, wherein the metal clip is open.

Reference will now be made to the drawing figures to describe the preferred embodiment of the present invention in detail.

Figure 3:
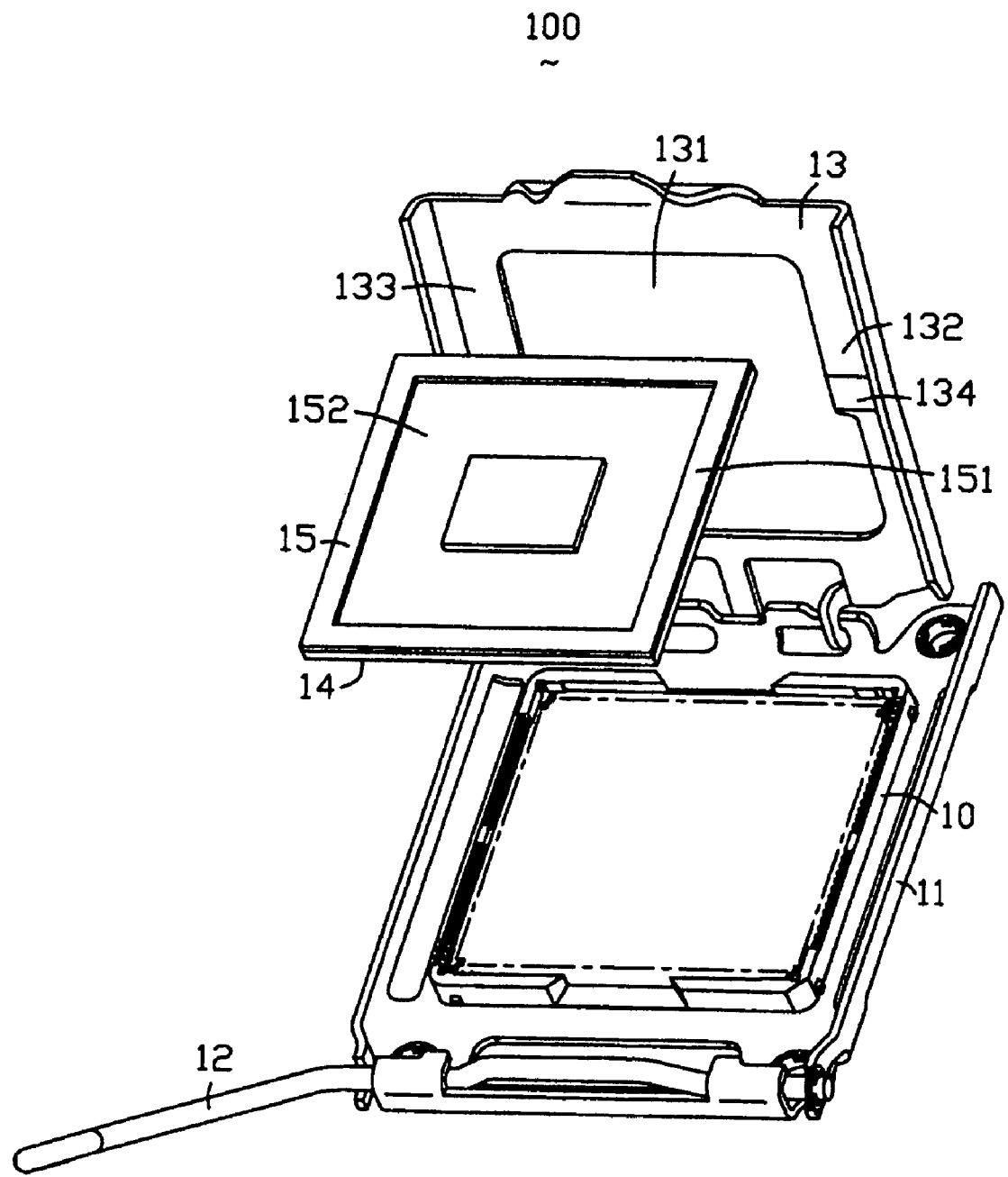
FIG. 3 is an exploded perspective view of an electrical connector assembly in accordance with the first embodiment of the present invention, wherein the metal clip is open.

Referring to FIG. 3, an electrical connector 100 in accordance with the present invention includes a housing 10, a plurality of signal terminals, a chip module 14 mounted on the housing 10, a stiffener 11 disposed around the housing 10, a metal clip 12 and a lever 13 attached on two ends of the stiffener 11, and a securing plate 15 disposed between the metal clip 12 and the chip module 14.

The securing plate 15 is generally rectangular and comprises a carrying portion 151 and a radiating portion 152. The relative area ratio between the carrying portion 151 and the radiating portion 152 can be altered in line with the force distribution and parts layout of the chip module 14. In this state, the radiating portion 152 can meet specific demand of heat dissipation. In this embodiment, the securing plate 15 is packaged with the chip module 14 as a unity.

The metal clip 13 is hollow and comprises an opening 131 in the center thereof, a first lateral side 132, a second lateral side 133, and a pressing portion 134 formed in a central portion of each lateral side and projected toward the housing 10.

In assembly, the stiffener 11 is firstly mounted on the housing 10 receiving the terminals. Then, the metal clip 13 and the lever 12 are attached on two ends of the stiffener 11. Thereafter, the housing 10 with stiffener 11 is further fixed on the printed circuit board by a locking device (not shown). And then terminals received in the housing 10 are soldered to the printed circuit board. At last, the chip module 14 attached with the securing plate 15 is mounted on the upper surface of the housing 10. The metal clip 13 is oriented to abut against the securing plate 15 mounted on the housing 10. At this moment, the pressing portion 134 abuts against the securing plate 15 attached on the upper surface of the chip module 14.

Figure 4:
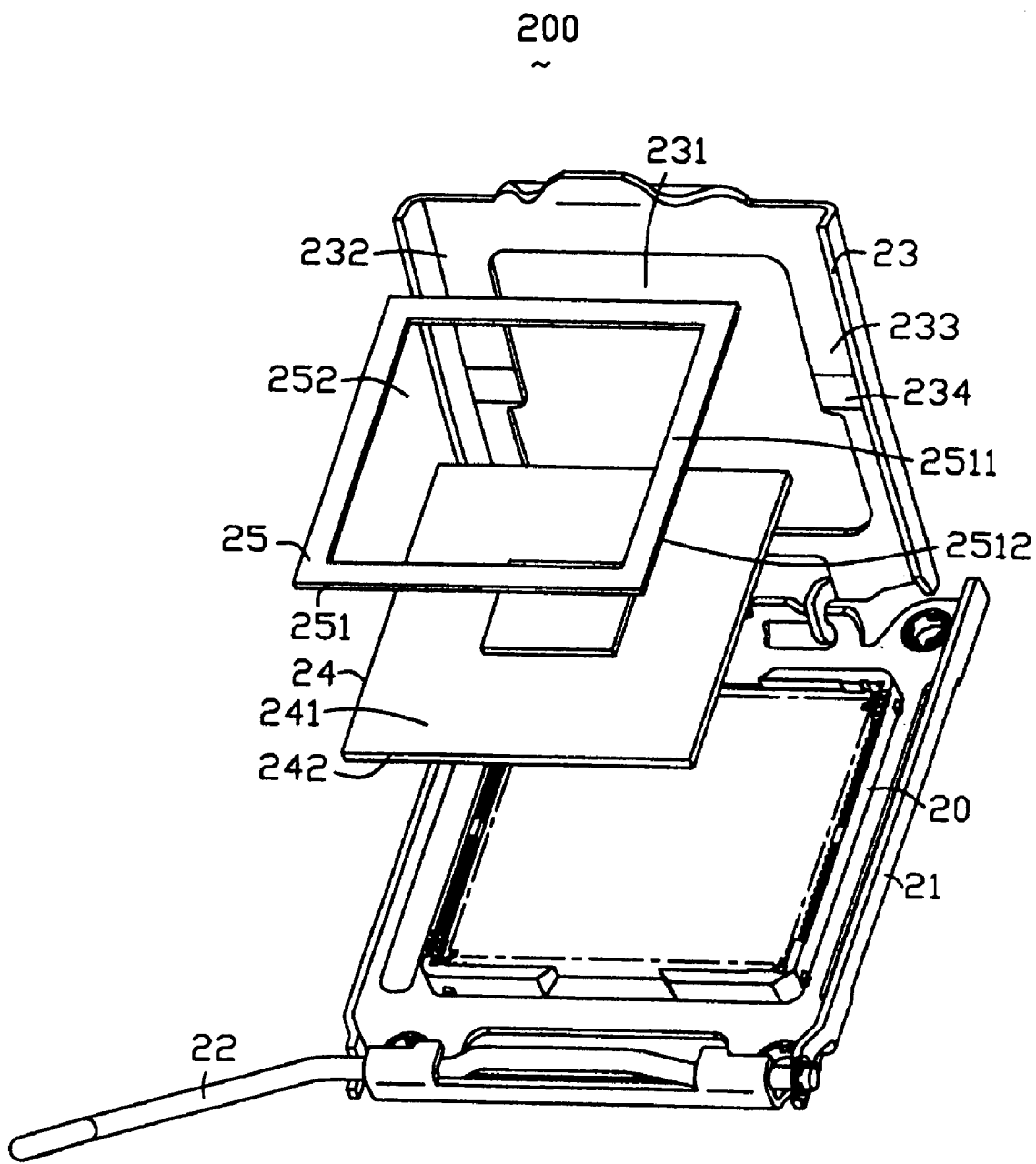
FIG. 4 is an exploded perspective view of an electrical connector assembly in accordance with the second embodiment of the present invention, wherein the metal clip is open.

Referring to FIG. 4, an electrical connector assembly 200 in correspondence with the second embodiment of the invention comprises a housing 20, a plurality of terminals, a chip module 24 mounted on the housing 20, a stiffener 21 disposed around the housing 20, a metal clip 23 and a lever 22 engaged with two opposite ends of the stiffener 23, and a securing plate 25 disposed between the metal clip 23 and the chip module 24.

The chip module 24 defines an upper surface 241 and a lower surface 242, wherein the upper surface 241 is divided into an outer section with a lower strength and an inner section with a higher strength. The inner section herein is defined as the thermal conductive block and labeled by 243 in FIG. 5.

The securing plate 25 is hollow and comprises a carrying portion 251 and a radiating portion 252, wherein the carrying portion 251 defines an upper surface 2511 and a lower surface 2512. The lower surface 2511 of the carrying portion 251 is attached on the outer section of the upper surface 241.

In assembly, the stiffener 21 is firstly mounted around the housing 20. Then the metal clip 23 and the lever 22 are engaged with the two opposite ends of the stiffener 21. Then the terminals received in the housing 20 are soldered with printed circuit board. At last the chip module 24 is inserted into the housing 20. The securing plate 25 is disposed between the metal clip 23 and the chip module 24.

Figure 5:
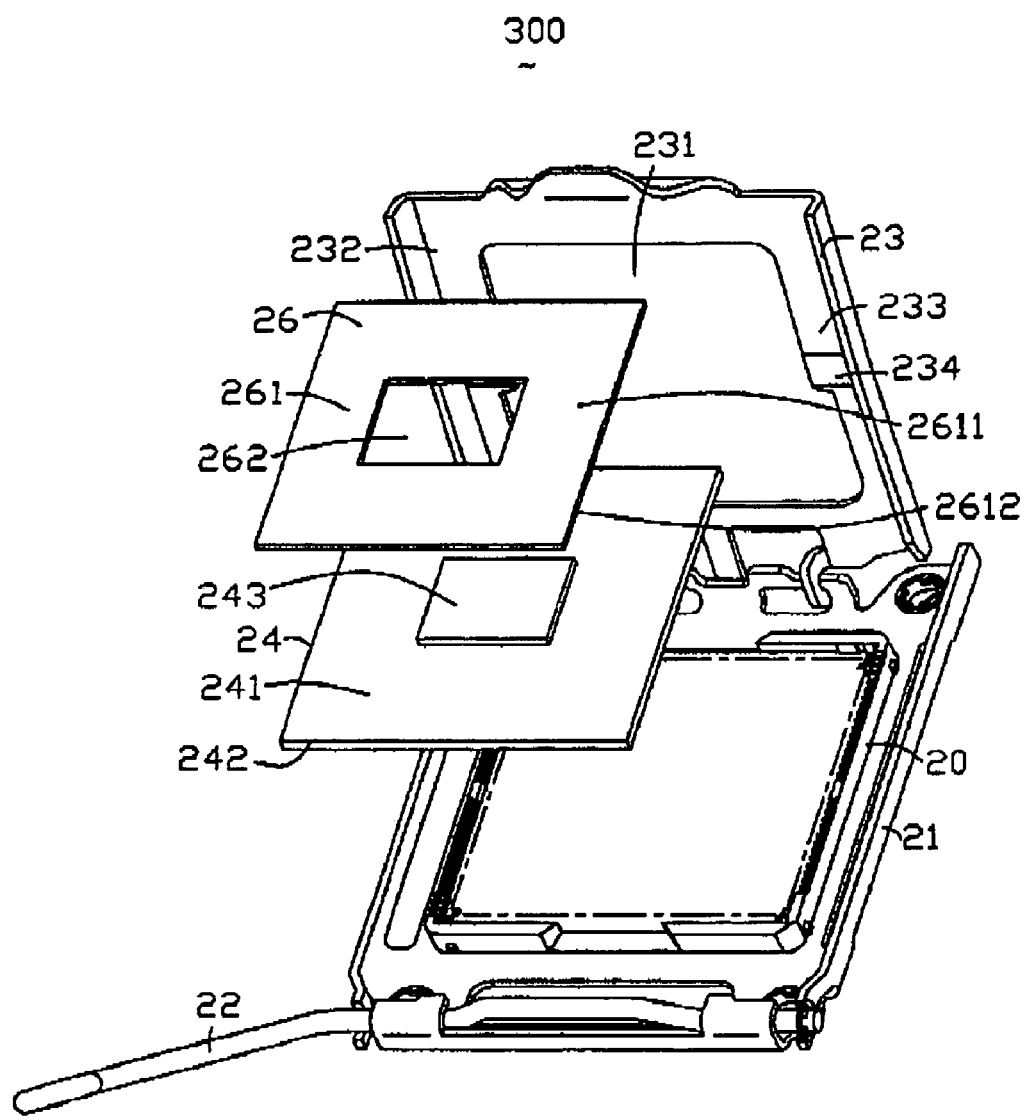
FIG. 5 is an exploded perspective view of an electrical connector assembly in accordance with the third embodiment of the present invention, wherein the metal clip is open.

Referring to FIG. 5, a securing portion 26 of the electrical connector assembly 300 in accordance with the third embodiment of the invention comprises a carrying portion 261 and a radiating portion 262, wherein the carrying portion 261 defines an upper surface 2611 and a lower surface 2612. The lower surface 2612 of the carrying portion 261 is attached on the upper surface 241 of the chip module 24.

Figure 6:
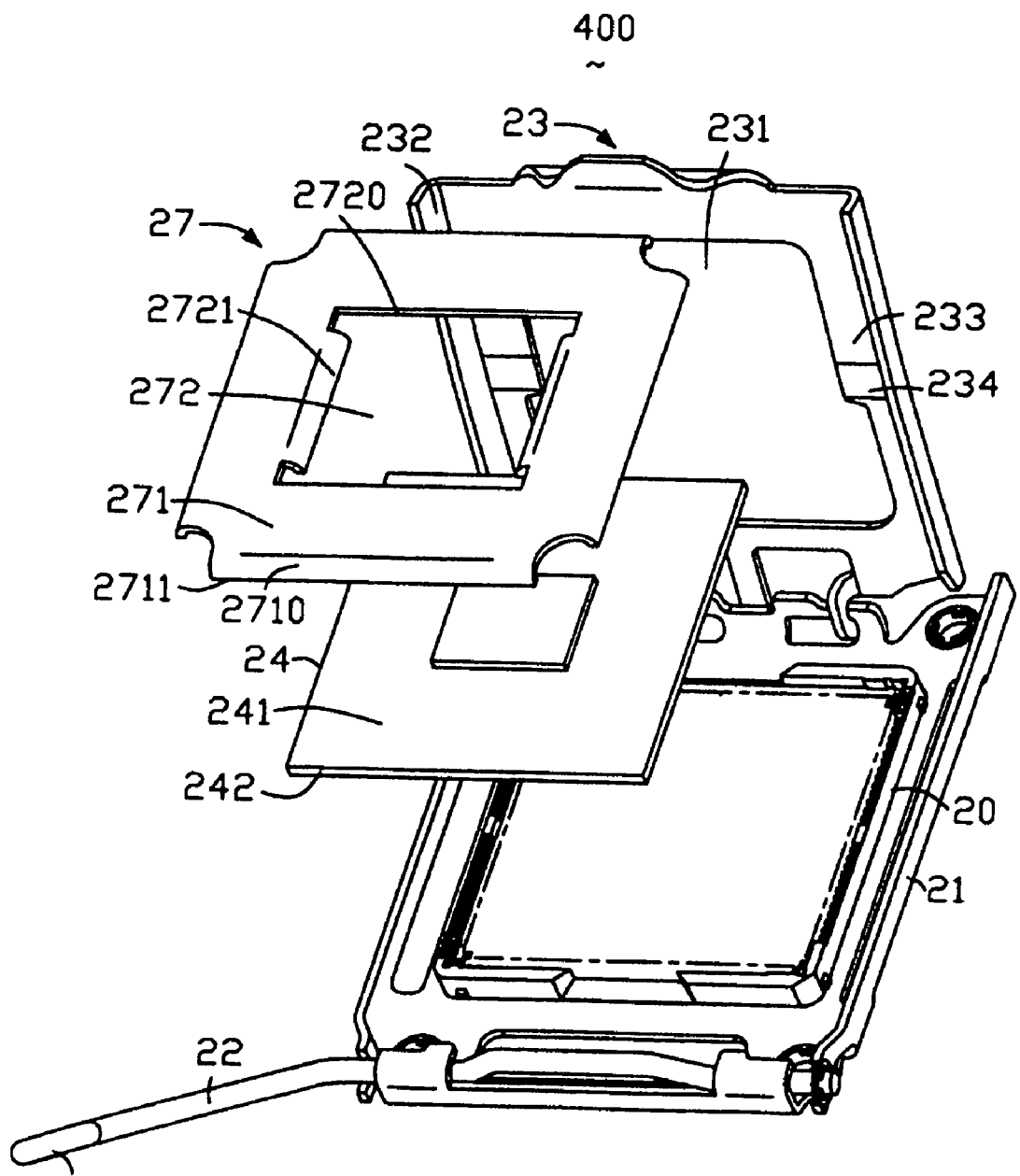
FIG. 6 is an exploded perspective view of an electrical connector assembly in accordance with the fourth embodiment of the present invention, wherein the metal clip is open.
Figure 7:
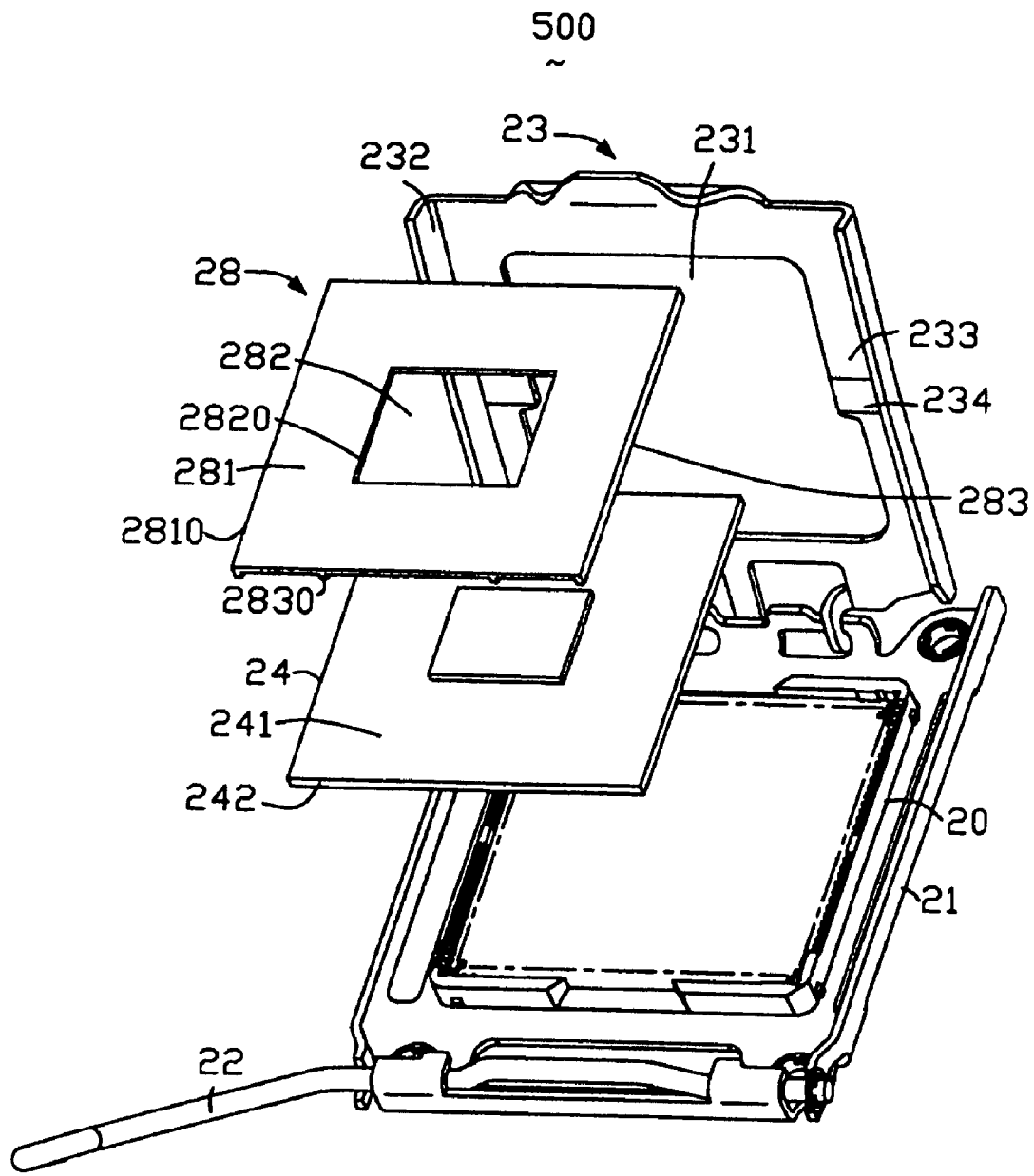
FIG. 7 is an exploded perspective view of an electrical connector assembly in accordance with the fifth embodiment of the present invention, wherein the metal clip is open.
Figure 8:
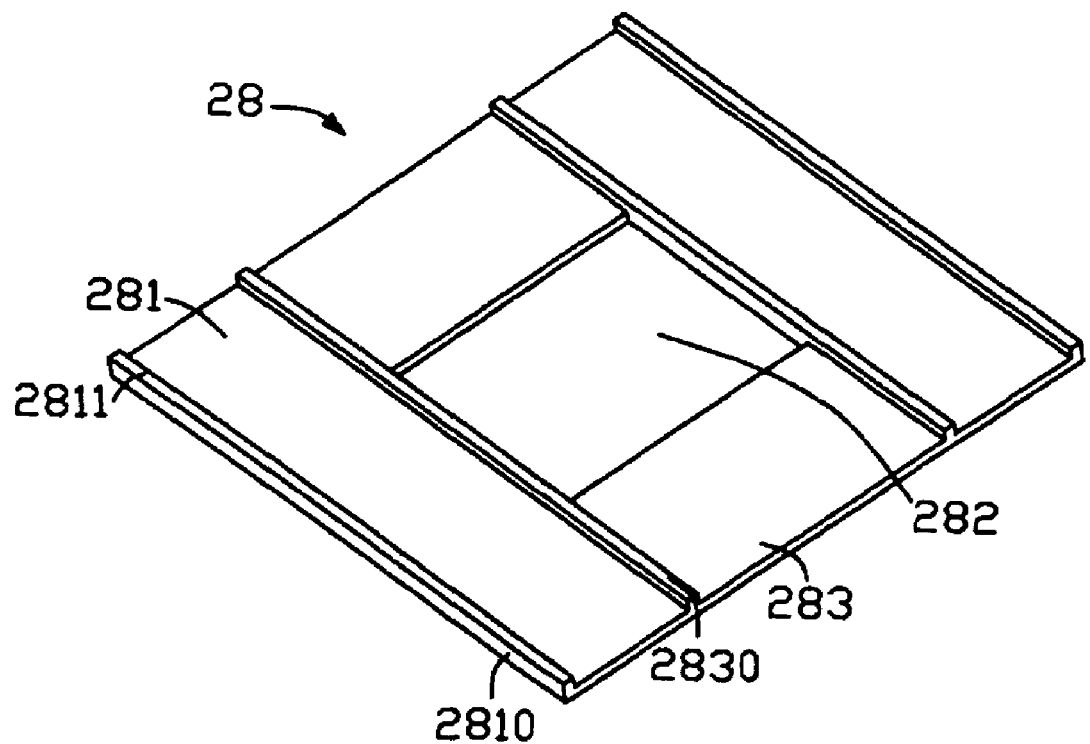
FIG. 8 is an isometric view of the securing plate shown in FIG. 7 in other perspective.

Referring to FIGS. 6-8, an electrical connector assembly in accordance with the fourth and the fifth embodiment of the invention comprises a securing plate and a reinforcing member formed on the securing plate for further enhancing the supporting effect and improving the heat circulation.

Referring to FIG. 6, a securing portion 27 of the electrical connector assembly 400 corresponding to the invention comprises a curved carrying portion 271 and a radiating portion 272. The carrying portion 271 defines two pairs of opposite flanges 2710 and the radiating portion 272 defines two pairs of opposite sidewalls 2720. The reinforcing member is a pair of first ribs 2711 defined on the flanges 2710 and a pair of second ribs 2721 defined on the sidewalls 2720. In assembly, the first ribs 2711 and the second ribs 2721 abut against the upper surface 241 of the chip module 24. The first ribs 2711 and the second ribs 2721 can be defined as a continuous or discontinuous structure on the basis of the real situation. The curved carrying portion 271 can improve the air circulation and the heat-dissipating situation of the chip module 24.

Referring to FIGS. 7-8, an electrical connector assembly 500 in accordance with the fifth the embodiment of the invention defines a securing plate 28, which comprises a carrying portion 281, a radiating portion 282 and a bottom surface 283. The carrying portion 281 defines two pairs of flanges and two pairs of sidewalls surrounding the radiating portion 282 wherein the first flanges 2810 abut against the pressing portion 234 of the metal clip 23 and the first sidewalls 2820 are paralleled to the first flanges 2810. The reinforcing member can be defined as predetermined ribs or projections. In this embodiment, the reinforcing member is a pair of continuous first ribs 2811 disposed on the first flanges 2810 and a pair of second ribs 2830 disposed on the bottom 283 and parallel to the first ribs 2811. In assembly, the first ribs 2811 and the second ribs 2830 abut against the upper surface of the chip module 24.

In the fourth and fifth embodiment of the invention, the reinforcing member of the securing plate can avoid parts disposed on the chip module which can simplify arrangement of the parts disposed on the chip module and enhance the heat dissipating effect.

In conclusion, the relative area ratio between the carrying portion and the radiating portion can be altered in view of the parts disposed on the chip module and the required radiating effect.

As aforementioned, the area of the securing portion abutting against the chip module is greater than the area of the pressing portion abutting against the chip module compared to a conventional electrical connector assembly and the securing plate has an inherent carrying ability, which can enhance the carrying effect, improve the deformation of the terminals and prevent the terminals from damage. In a word, all embodiments of the invention can improve the reliability and stability of the electrical and mechanical connection of the electrical connector assembly.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An electrical connector assembly comprising:
an insulative housing defining opposite two ends;
a plurality of terminals loaded in the housing;
a metallic stiffener at least partially surrounding the housing;
a chip module mounted onto the housing and located above the terminals;
a clip pivotally located about one end of the stiffener and defining a first central opening;
a lever pivotally located about the other end of the stiffener; and
a securing place disposed under the chip and between the clip and the chip module, the securing plate abutting against the upper surface of the chip module; wherein
said securing plate is independent from both said housing and said stiffener without a fixed connection therebetween so as to be easily removed away during unloading the clip module from the housing.

2. The electrical connector as claimed in claim 1, wherein the securing plate is essentially smaller than the insulative housing and protectively embedded within an under space defined by the clip.

3. The electrical connector as claimed in claim 1, wherein said securing plate is planar.

4. The electrical connector as claimed in claim 1, wherein said securing plate is permanently associated with the chip module.

5. The electrical connector as claimed in claim 1, wherein said securing plate defines a second central opening essentially vertically aligned with the first opening.

6. The electrical connector as claimed in claim 5, wherein the first central opening is larger than the second central opening.

7. The electrical connector as claimed in claim 5, wherein said chip module defining an upper surface with thereon a central upwardly protruding terminal conductive block which is received in the second central opening.

8. The electrical connector as claimed in claim 7, wherein the thickness of the securing plate is similar to a height of said thermal conductive block.

* * * * *